US009291881B2

(12) United States Patent
Asai

(10) Patent No.: US 9,291,881 B2
(45) Date of Patent: Mar. 22, 2016

(54) IMAGING APPARATUS

(75) Inventor: Yoshikazu Asai, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/454,995

(22) Filed: Apr. 24, 2012

(65) Prior Publication Data
US 2012/0273656 A1 Nov. 1, 2012

(30) Foreign Application Priority Data

Apr. 26, 2011 (JP) .................................. 2011-098587

(51) Int. Cl.
*H01L 27/146* (2006.01)
*H04N 5/225* (2006.01)
*G03B 19/12* (2006.01)

(52) U.S. Cl.
CPC ........... *G03B 19/12* (2013.01); *H01L 27/14625* (2013.01); *H04N 5/2253* (2013.01)

(58) Field of Classification Search
CPC .............. G03B 9/12; H01L 27/14618; H01L 27/14625; H01L 27/14634; H04N 5/2251; H04N 5/2257; H04B 5/2253
USPC ............... 250/239, 208.1, 216; 348/335, 340, 348/373, 374; 257/431, 432, 433, 434, 435; 438/64, 65, 66, 67; 396/542; 156/297, 156/299
See application file for complete search history.

(56) References Cited

U.S. PATENT DOCUMENTS

| 5,455,386 | A | * | 10/1995 | Brathwaite et al. | ........... | 174/529 |
|---|---|---|---|---|---|---|
| 5,837,090 | A | * | 11/1998 | Binnie et al. | .................. | 156/294 |
| 6,654,064 | B2 | * | 11/2003 | Ishikawa | ....................... | 348/374 |
| 6,779,725 | B2 | * | 8/2004 | Kohchi et al. | ................. | 235/454 |
| 6,956,615 | B2 | * | 10/2005 | Nakagishi et al. | ............ | 348/374 |
| 7,436,443 | B2 | * | 10/2008 | Hirunuma et al. | ........... | 348/294 |
| 7,583,309 | B2 | * | 9/2009 | Aizawa et al. | ................ | 348/340 |
| 7,645,981 | B2 | * | 1/2010 | Tanaka et al. | ................. | 250/239 |
| 7,829,833 | B2 | * | 11/2010 | Kobayashi et al. | ........ | 250/208.1 |
| 7,973,854 | B2 | * | 7/2011 | Kobayashi | ..................... | 348/373 |
| 7,990,470 | B2 | * | 8/2011 | Lin et al. | ....................... | 348/374 |
| 8,025,950 | B2 | * | 9/2011 | Saito | ............................. | 428/137 |
| 2001/0010562 | A1 | * | 8/2001 | Nakagishi et al. | ............ | 348/374 |
| 2004/0238947 | A1 | * | 12/2004 | Rumer et al. | ................. | 257/707 |
| 2008/0251289 | A1 | * | 10/2008 | Palmeri et al. | ................ | 174/263 |
| 2009/0040368 | A1 | * | 2/2009 | Lin et al. | ....................... | 348/374 |
| 2009/0303360 | A1 | * | 12/2009 | Huang | .......................... | 348/294 |
| 2010/0151192 | A1 | * | 6/2010 | Saito | ............................. | 428/137 |
| 2011/0298968 | A1 | * | 12/2011 | Tseng et al. | .................. | 348/373 |
| 2012/0273656 | A1 | * | 11/2012 | Asai | ........................... | 250/208.1 |

FOREIGN PATENT DOCUMENTS

| CN | 1441309 | A | 9/2003 |
|---|---|---|---|
| CN | 1746762 | A | 3/2006 |

(Continued)

*Primary Examiner* — John Lee
(74) *Attorney, Agent, or Firm* — Canon USA Inc. IP Division

(57) ABSTRACT

An image sensor is positioned at a fixing member and adheres to and is fixed to the fixing member by pouring an adhesive into the opening. The opening is formed in a shape that extends in a short-side direction of the image sensor at a position corresponding to a substantially central portion of the image sensor in a long-side direction. The opening is formed such that an opening width on a side not facing the image sensor is larger than an opening width on a side facing the image sensor.

8 Claims, 10 Drawing Sheets

(56) References Cited

FOREIGN PATENT DOCUMENTS

| | | |
|---|---|---|
| CN | 1870725 A | 11/2006 |
| CN | 01870725 A | 11/2006 |
| CN | 101236280 A | 8/2008 |
| CN | 201289538 A | 8/2009 |
| JP | 2006-094444 A | 4/2006 |
| JP | 2006-203624 A | 8/2006 |
| JP | 2007-227673 A | 9/2007 |
| JP | 2010-147700 A | 7/2010 |
| JP | 2011-018080 A | 1/2011 |

\* cited by examiner

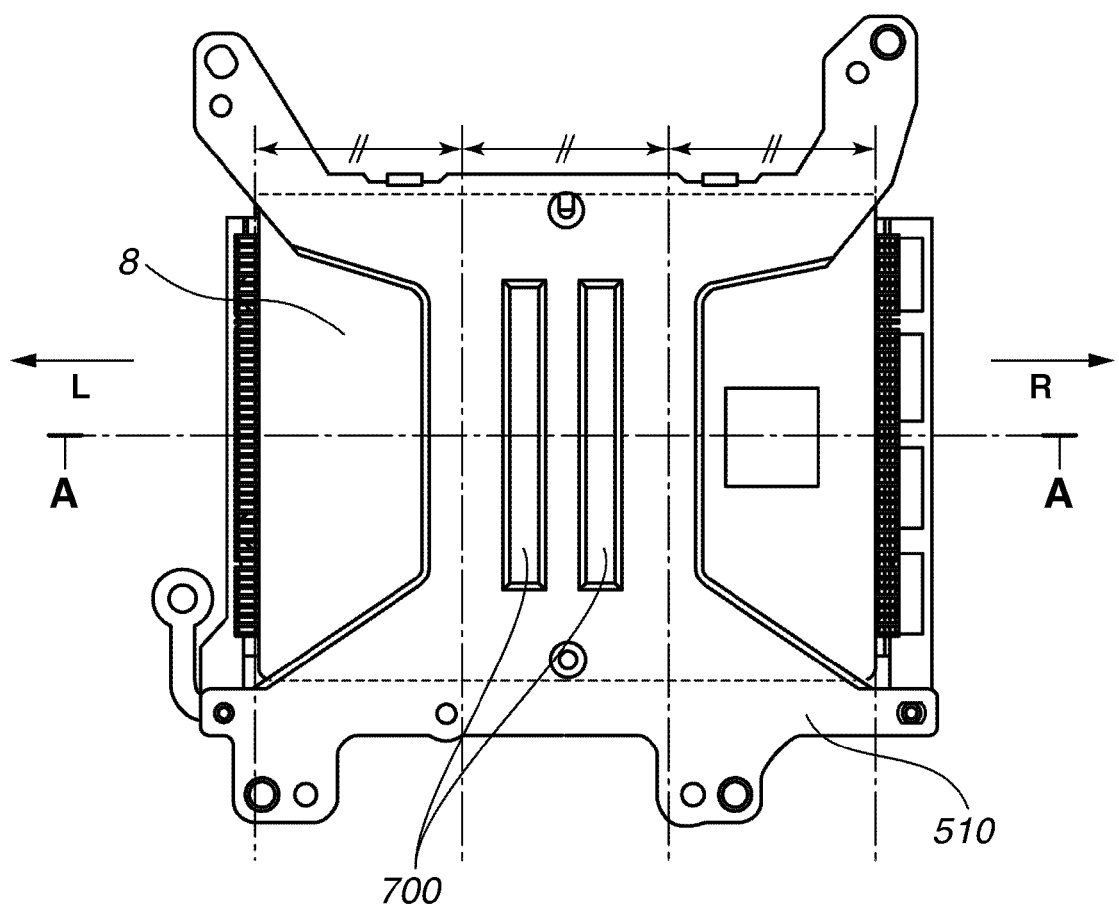

FIG.10
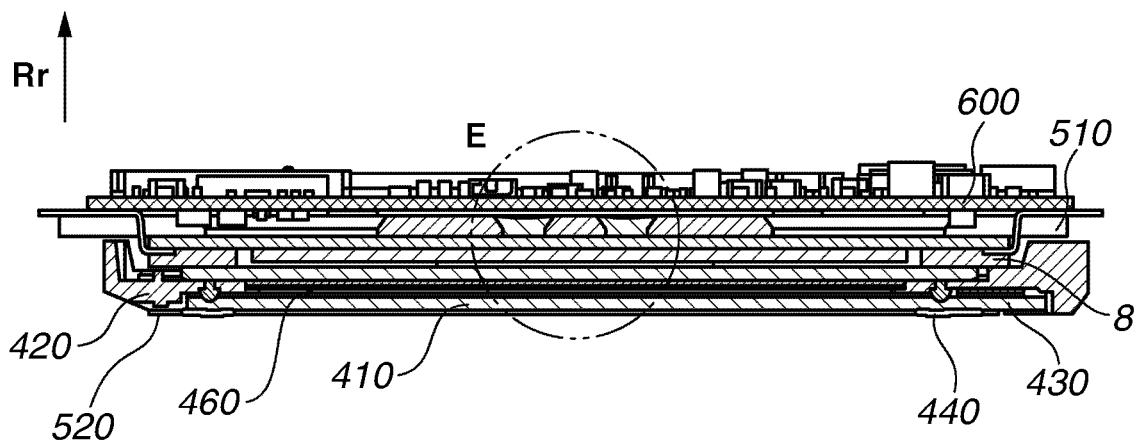
SECTION D-D
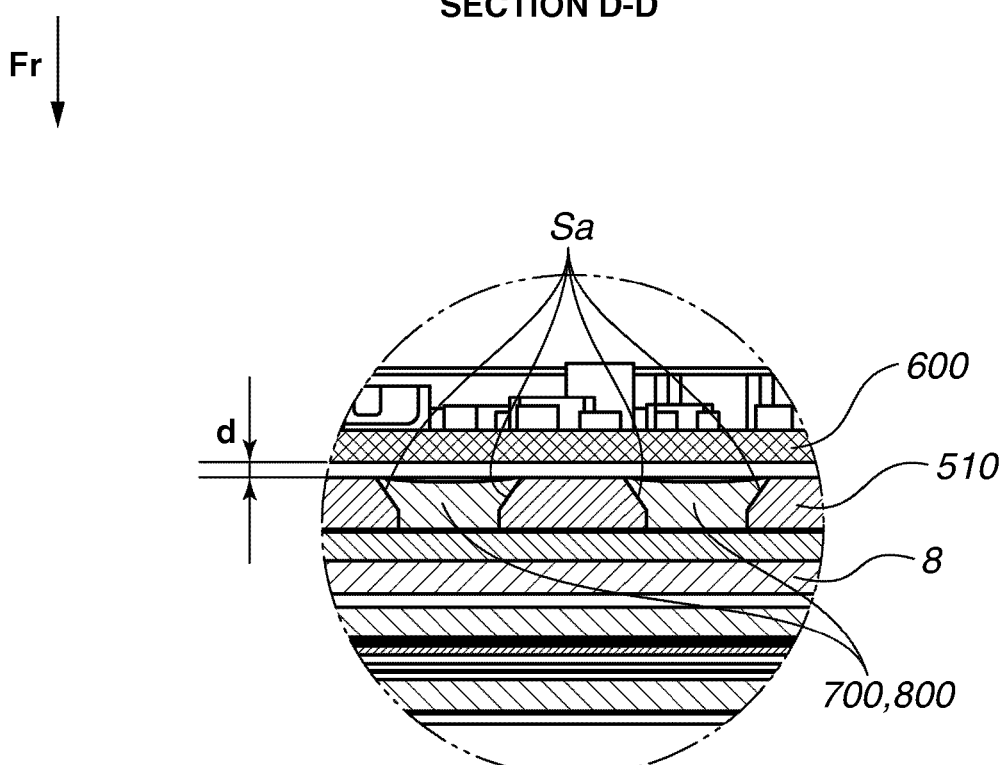
DETAIL E

IMAGING APPARATUS

BACKGROUND OF THE INVENTION

1. Field of the Invention

The present invention relates to an imaging apparatus, and more particularly, to an imaging apparatus which allows an image sensor to adhere to and to be fixed to a fixing member.

2. Description of the Related Art

An imaging apparatus, such as a digital camera, captures an image by converting an object image into an electric signal. The imaging apparatus receives a shooting light flux by an image sensor, converts a photoelectric conversion signal output from the image sensor into image data, and records the image data in a recording medium such as a memory card. A charge coupled device (CCD) or a complementary metal oxide semiconductor (CMOS) sensor is used as the image sensor.

Such an imaging apparatus needs to keep an image sensor at a high level of reliability, while accurately maintaining a relative positional relation among a plurality of optical components. In the case of a digital single-lens reflex camera using a recent large-sized image sensor, a relative positional relation between an image sensor and an optical viewfinder and a positional accuracy in a shooting focus direction are required.

For example, Japanese Patent Application Laid-Open No. 2007-227673 discuses technique in which an image sensor adheres to and is fixed to other components or a substrate to form an imaging unit, and the imaging unit is held with respect to an imaging apparatus. According to an adhering method discussed in Japanese Patent Application Laid-Open No. 2007-227673, an adhesion-purpose opening is disposed in an image sensor fixing member within a range of projecting the image sensor. The image sensor is fixed by pouring an adhesive into the opening of the image sensor fixing member.

Also, Japanese Patent Application No. 2006-203624 discuses an adhering method in which openings of an image sensor fixing member are disposed substantially uniformly within a range of projecting an image sensor. Therefore, since adhesion-purpose openings are disposed substantially uniformly, strength enough to withstand a drop impact of a camera can be obtained.

However, in the imaging unit discussed in Japanese Patent Application No. 2007-227673, the adhesion-purpose opening is provided at one position corresponding to a central location of the image sensor, and the cross-sectional shape of the opening is straight in a thickness direction. Therefore, sufficient adhesion strength is difficult to be obtained. It is described therein that the adhesion strength is about 10 times the weight of the imaging unit.

Further, in the imaging unit discussed in Japanese Patent Application No. 2006-203624, since the adhesion-purpose openings are disposed substantially uniformly on the backside of the image sensor, a sufficient strength can be obtained. However, in the case that the openings adhere to and are fixed to the back side of the image sensor over a wide range, when the image sensor is placed under high temperature or low temperature, since the image sensor and the image sensor fixing member are different members, the image sensor is greatly deformed by the influence of a thermal strain caused by a difference in linear expansion coefficient.

SUMMARY OF THE INVENTION

The present invention is directed to ensure a sufficient adhesion strength to the adhering and fixing of an image sensor and an image sensor fixing member, and reduce the deformation of the image sensor due to a difference in linear expansion coefficient between the image sensor and the image sensor fixing member under high temperature or low temperature.

According to an aspect of the present invention, an imaging apparatus includes an image sensor and a fixing member in which an opening is formed, wherein the image sensor is positioned at the fixing member and adheres to and is fixed to the fixing member by pouring an adhesive into the opening, the opening is formed in a shape that extends in a short-side direction of the image sensor at a position corresponding to a substantially central portion of the image sensor in a long-side direction, and the opening is formed such that an opening width on a side not facing the image sensor is larger than an opening width on a side facing the image sensor.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 5 is a rear view describing an adhesion-purpose opening of an image sensor fixing member according to an exemplary embodiment of the present invention.

FIG. 10 is a cross-sectional view taken along the line D-D of FIG. 9 and a detailed view thereof.

DESCRIPTION OF THE EMBODIMENTS

Various exemplary embodiments, features, and aspects of the invention will be described in detail below with reference to the drawings.

In an exemplary embodiment, a digital single-lens reflex camera (hereinafter, referred to as a camera) adopted as an imaging apparatus will be described below. In the respective drawings, if necessary, an object side of a camera is denoted by a front Fr, a photographer side is denoted by a rear Rr, the right and left sides with respect to the photographer side are denoted by R and L, respectively.

Figure 1A:
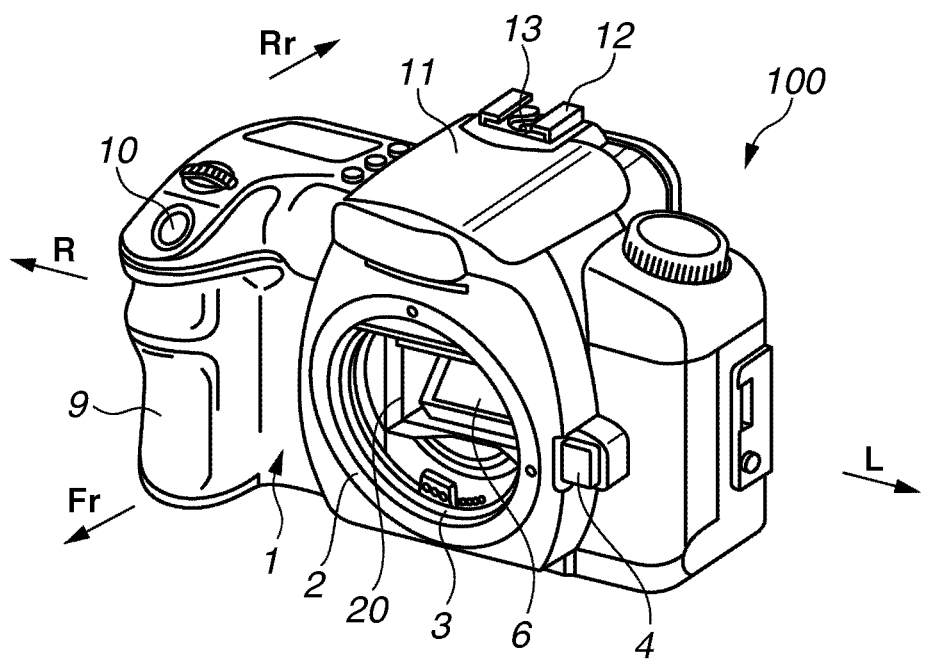
FIGS. 1A and 1B are perspective views illustrating a schematic entire configuration of a camera according to an exemplary embodiment of the present invention.
Figure 1B:
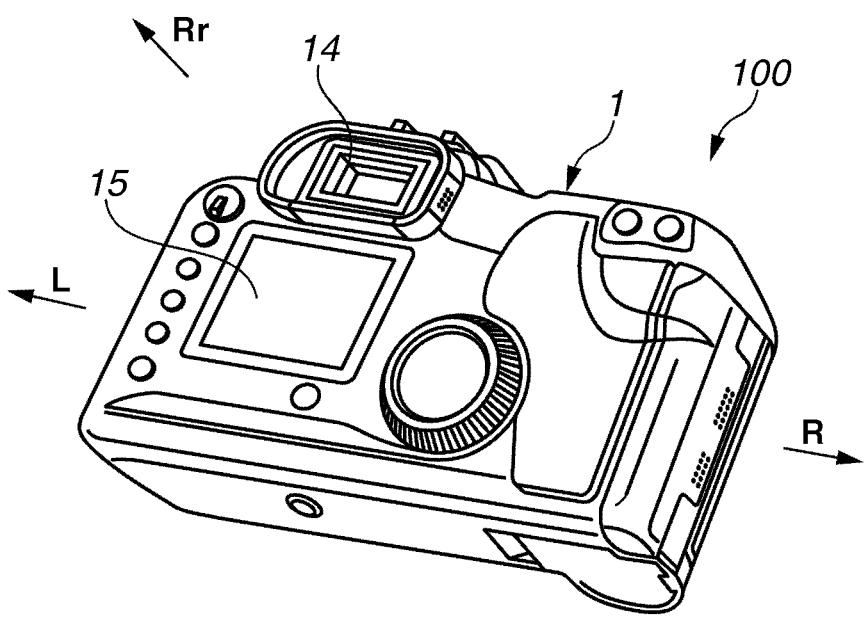
Figure 2:
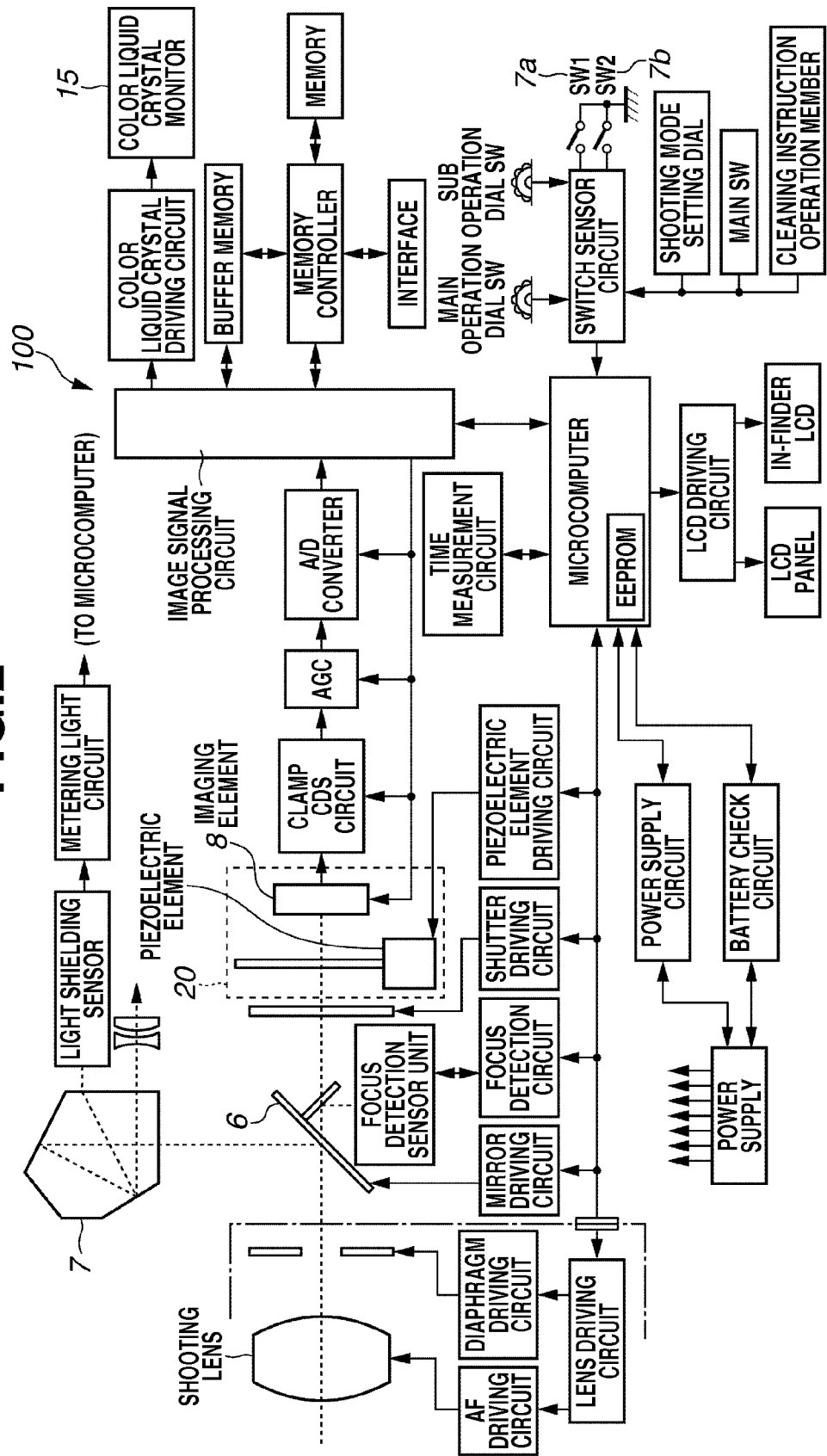
FIG. 2 is a diagram illustrating an electrical internal configuration of a camera according to an exemplary embodiment of the present invention.

First, a schematic entire configuration of a camera according to an exemplary embodiment of the present invention will be described with reference to FIGS. 1A, 1B and 2. FIG. 1 is an outer appearance view of a camera according to an exemplary embodiment, with a shooting lens unit (not illustrated) removed. FIG. 1A is a perspective view when the camera is viewed from a front side (object side), and FIG. 1B is a perspective view when the camera is viewed from a rear side (photographer side). FIG. 2 is a diagram illustrating an electrical internal configuration of the camera.

As illustrated in FIG. 1A, in a front side of a camera body 1, amount unit 2 is installed to detachably fix a shooting lens unit. In the mount unit 2, amount contact 3 is installed to enable communications of a control signal, a state signal, a data signal, and the like, between the camera body 1 and the shooting lens unit, and to supply power to the shooting lens unit side. Also, in the camera body 1, a lens unlock button 4 is installed at a position adjacent to the mount unit 2. A user presses the lens unlock button 4 when removing the mounted shooting lens unit.

Inside the camera body 1, a mirror box 20 is installed to guide a shooting light flux passing through a shooting lens. Inside the mirror box 20, a main mirror (quick return mirror) 6 is disposed to reflect the shooting light flux in a predetermined direction. As illustrated in FIG. 2, the main mirror 6 changes to a state that is held at an angle of 45° to a shooting optical axis to guide the shooting light flux toward a pentagonal roof mirror 7. The main mirror 6 changes to a state that is held at a retracting position from the shooting light flux to guide the shooting light flux toward a solid-state image sensor 8 (hereinafter, referred to as an image sensor).

In the camera body 1, a grip unit 9 is installed so that a photographer can hold the camera body 1. In the grip unit 9, a release button 10 is installed to enable a photographer to instruct a shooting to the camera 100. As illustrated in FIG. 2, the release button 10 includes a SW1 (7a) and a SW2 (7b). The first stroke of the release button 10 turns the SW1 on and the second stroke turns the SW2 on.

A flash unit 11, which is protruded from the camera body 1, a flash mount shoe groove 12, and a flash contact 13, are installed on the top of the camera body 1.

As illustrated in FIG. 1B, on the back side of the camera body 1, a viewfinder eyepiece window 14 is installed to enable a photographer to observe a shooting light flux reflected by the above-described main mirror 6. A color liquid crystal monitor 15 capable of displaying an image is installed near the center of the back side of the camera body 1.

Figure 3A:
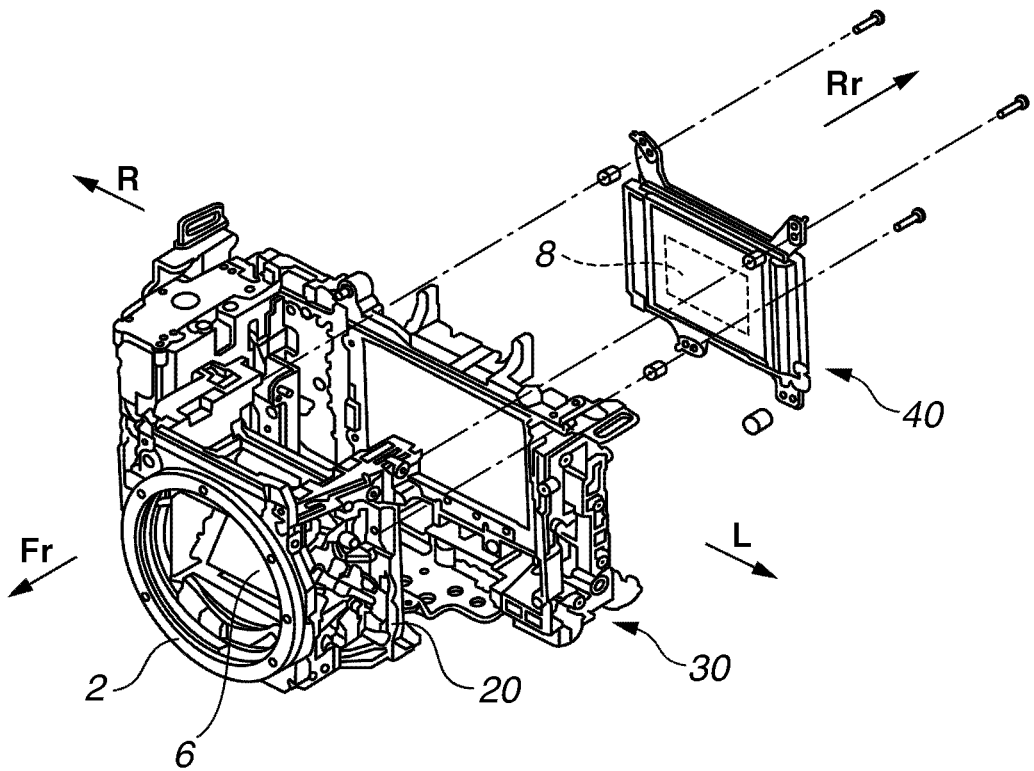
FIGS. 3A and 3B are exploded perspective views illustrating an imaging unit and peripheral components according to an exemplary embodiment of the present invention.
Figure 3B:
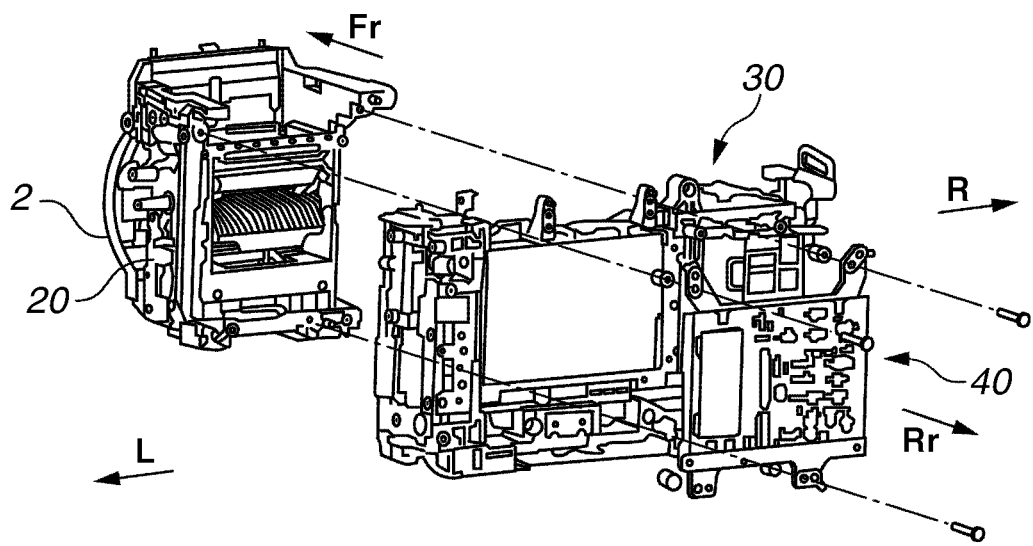

Next, an internal configuration of the camera 100 will be described with reference to FIGS. 3A and 3B. FIGS. 3A and 3B are perspective views illustrating the internal configuration of the camera. FIG. 3A is a perspective view when the camera is viewed from a front side, and FIG. 3B is a perspective view when the camera is viewed from a rear side. In FIG. 3A, components are disposed in order of a mount unit 2, a mirror box 20, a body base 30, and an imaging unit 40 along a shooting optical axis from a front side.

The camera body 1 includes the body base 30. In an object side of the body base 30, the above-described mirror box 20 and a shutter unit (not illustrated) are attached by a screw or the like.

In a photographer side of the body base 30, an imaging unit 40 to be described below is installed.

Also, a configuration of a periphery of the imaging unit 40 will be described. As illustrated in FIGS. 3A and 3B, in the object side of the body base 30 that is the framework of the camera body, the mirror box 20 and the shutter unit (not illustrated) are installed in order from the object side. Also, in the photographer side of the body base 30, the imaging unit 40 is installed. The imaging unit 40 is adjusted and fixed such that an imaging surface of the image sensor 8 is parallel at a predetermined distance apart from a mounting surface of the mount unit 2 being the standard to which the shooting lens unit is mounted.

Figure 4A:
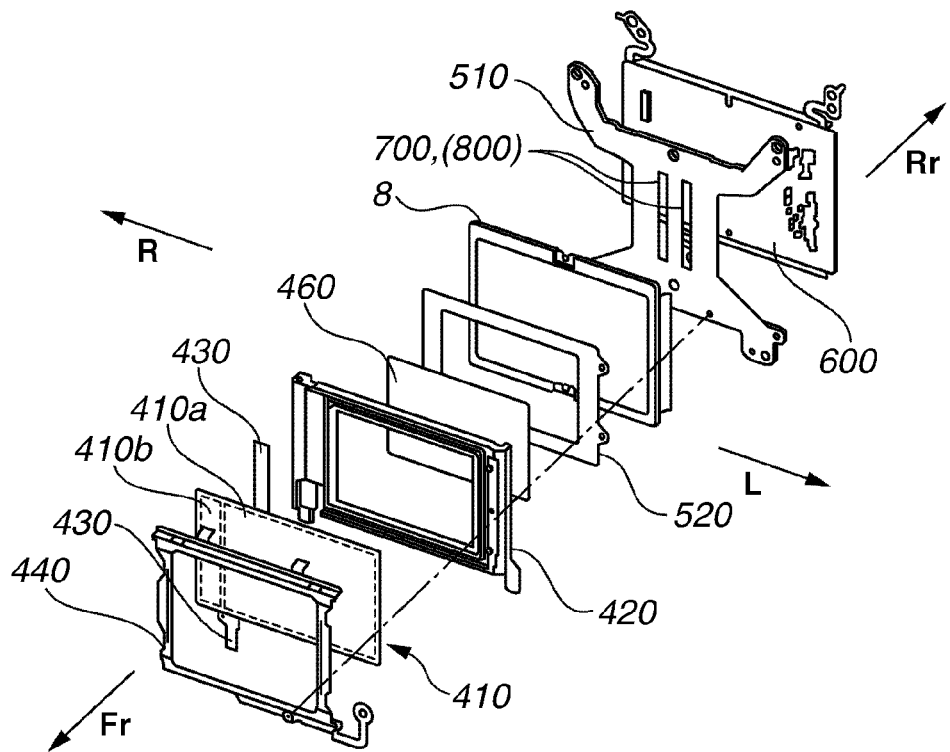
FIGS. 4A and 4B are exploded perspective views illustrating a configuration of an imaging unit according to an exemplary embodiment of the present invention.
Figure 4B:
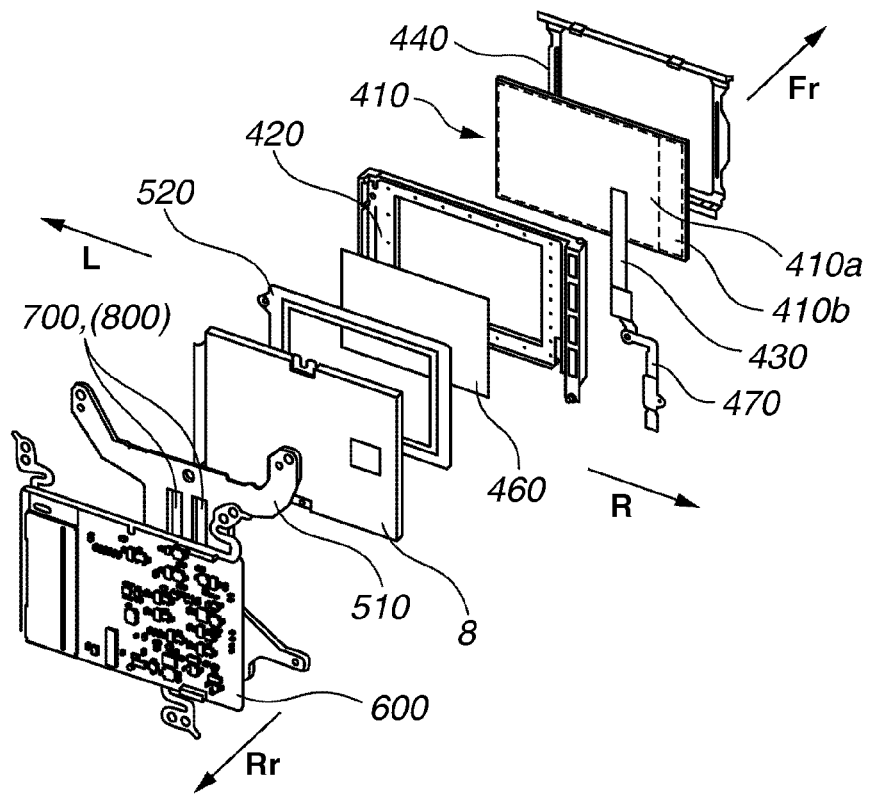

Next, the configuration of the imaging unit 40 will be described in detail with reference to FIGS. 4A and 4B. FIG. 4A is a perspective view when the imaging unit 40 is viewed from the front side, and FIG. 4B is a perspective view when the imaging unit 40 is viewed from the rear side.

An optical low-pass filter 410 is one sheet of a birefringent plate made of crystal and has a rectangular shape. The optical low-pass filter 410 has a peripheral edge portion 410b in which a piezoelectric element 430 is disposed at one side of a shooting effective area 410a. Therefore, the optical low-pass filter 410 is asymmetric in a direction perpendicular to the shooting optical axis (camera RL direction). The surface of the optical low-pass filter 410 disposed in this way is optically coated.

The piezoelectric element 430 has a rectangular strip shape of a single panel and is arranged such that a long side of the piezoelectric element 430 is parallel to a short side (lateral side) of the optical low-pass filter 410 at the peripheral edge portion 410b of the optical low-pass filter 410, and adheres and is held (attached). The piezoelectric element 430 is a vibration unit that vibrates the optical low-pass filter 410. Specifically, the piezoelectric element 430 adheres in parallel in close proximity to one of four sides of the optical low-pass filter 410. The piezoelectric element 430 vibrates the optical low-pass filter 410 in a wavelike fashion so that the wave has a plurality of nodes parallel to the one side. The driving of the piezoelectric element 430 removes foreign substance, such as dust, which is attached to the surface of the optical low-pass filter 410.

An optical low-pass filter holding member 420 holds the optical low-pass filter 410. The optical low-pass filter holding member 420 is made of a resin material or a metallic material. The optical low-pass filter holding member 420 adheres to and is fixed to the image sensor 8 by a double-sided tape 520. The double-sided tape 520 also serves as a mask that prevents unnecessary light from being incident on the image sensor 8 from the outside of the shooting optical path.

A flexible printed circuit board 470 for the piezoelectric element adheres to and is fixed to the piezoelectric element 430 and can also apply a voltage to the piezoelectric element 430. Due to the application of the voltage, the piezoelectric element 430 performs a stretching vibration mainly in a direction (R-L) perpendicular to the optical axis, and resonates (vibrates) the optical low-pass filter 410.

An urging member 440 urges the optical low-pass filter 410 in an optical axis direction and is latched to the optical low-pass filter holding member 420 or the image sensor fixing member 510. The urging member 440 is made of a material having a conductive property, and is electrically connected to the image sensor fixing member 510 by a screw. Therefore, the surface (optically coated surface) of the optical low-pass filter 410 brought into contacts with the urging member 440 is also electrically connected to the image sensor fixing member 510. The image sensor fixing member 510 becomes a ground potential of the camera body 1. Therefore, the surface of the optical low-pass filter 410 also becomes the ground potential of the camera body 1, which can suppress electrostatic adhesion of dusts or the like to the surface of the optical low-pass filter 410.

In the optical low-pass filter holding member 420, an elastic member, whose cross section has a substantially circular frame shape, is double-shot-molded or insert-molded, or is disposed as a separate body. The elastic member is attached tightly and sealed by the optical low-pass filter 410.

An optical member 460 is formed by laminating a phase plate (depolarization plate), an infrared cut filter, and a birefringent plate whose refraction direction is different from that of the optical low-pass filter 410 by 90°. The optical member 460 adheres to and is fixed to the optical low-pass filter holding member 420.

The image sensor fixing member 510 is formed in a plate shape and includes rectangular openings 700 in a thickness direction. After positioning the image sensor 8 at the image sensor fixing member 510, the image sensor fixing member 510 and the image sensor 8 adhere to and are fixed to each other by pouring an adhesive 800 into the openings 700 of the image sensor fixing member 510. Around the image sensor fixing member 510, an arm is provided for screw fixing to the mirror box 20.

A signal processing board 600 is mounted with a circuit that is electrically connected to the image sensor 8 to operate the image sensor 8.

Next, the adhering and fixing of the image sensor 8 and the image sensor fixing member 510 will be described in detail.

FIG. 5 is a diagram when the image sensor 8 and the openings 700 of the image sensor fixing member 510 are viewed from the rear side. In addition, FIG. 6 is a cross-sectional view taken along the line A-A of FIG. 5 and a detailed view thereof.

As illustrated in FIG. 5, two openings 700 are formed in the image sensor fixing member 510. The openings 700 are formed extending in a short-side direction of the image sensor 8 at a position corresponding to the substantially central portion of the image sensor 8 in a long-side direction. By pouring the adhesive 800 into the openings 700, the image sensor 8 and the image sensor fixing member 510 strongly adhere to and are fixed to each other. Also, in the exemplary embodiment, although an example of forming the two openings 700 is described, one or a plurality of openings 700 may be formed.

Figure 6:
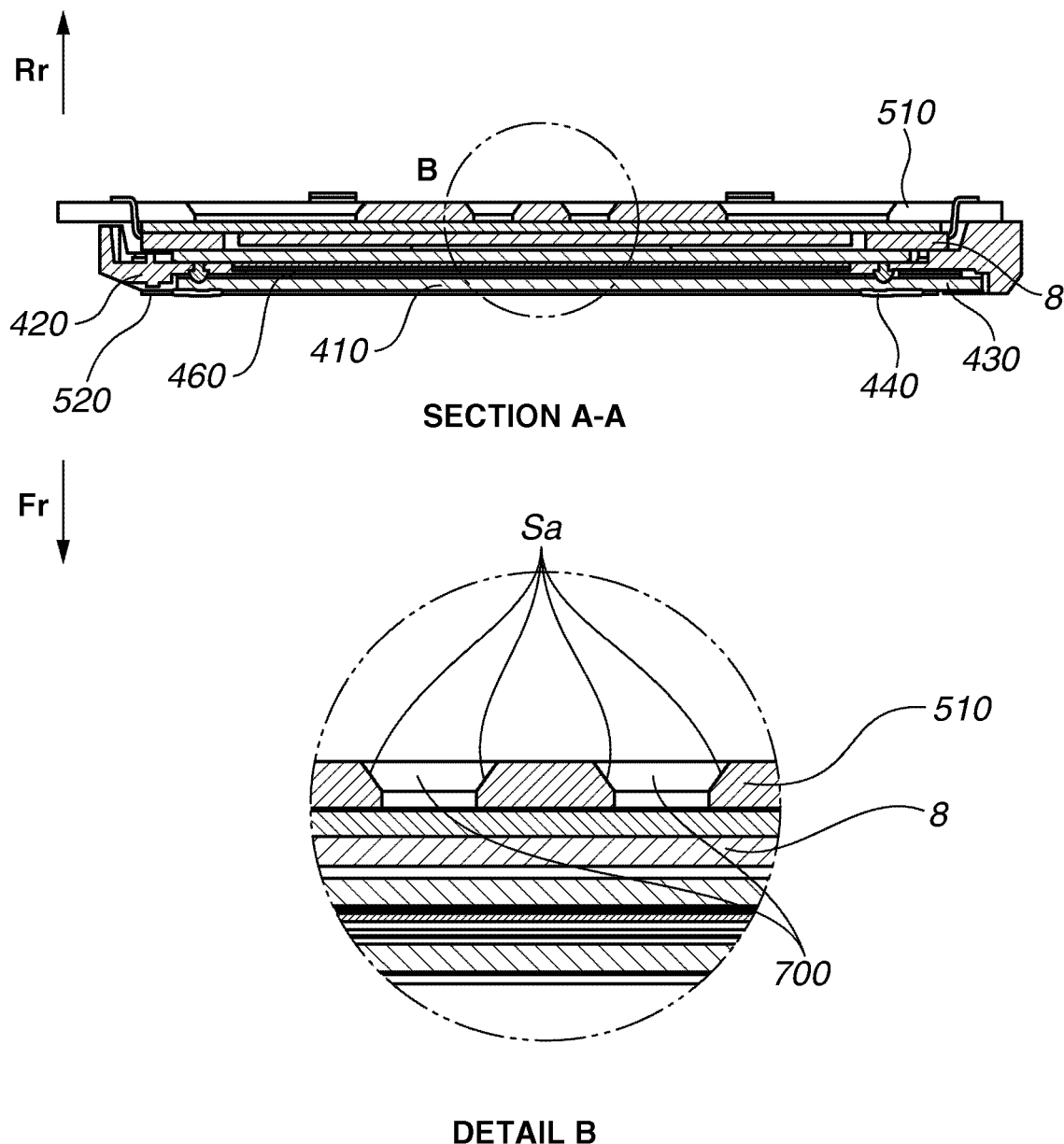
FIG. 6 is a cross-sectional view taken along the line A-A of FIG. 5 and a detailed view thereof.

In addition, as illustrated in the cross-sectional view of FIG. 6, chamfered portions Sa are formed by chamfering the openings 700 on a side not facing the rear surface of the image sensor 8. Specifically, by chamfering the openings 700 on the side not facing the rear surface of the image sensor 8, an opening width on the side not facing the rear surface of the image sensor 8 is formed to be larger than an opening width on the side facing the rear surface of the image sensor 8.

Figure 7A:
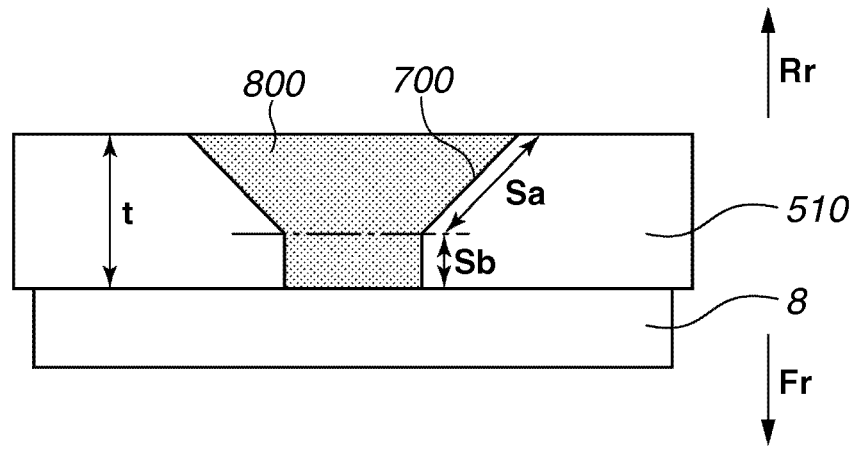
FIGS. 7A, 7B and 7C are diagrams describing in detail a cross section of an adhesion-purpose opening of an image sensor fixing member.
Figure 7B:
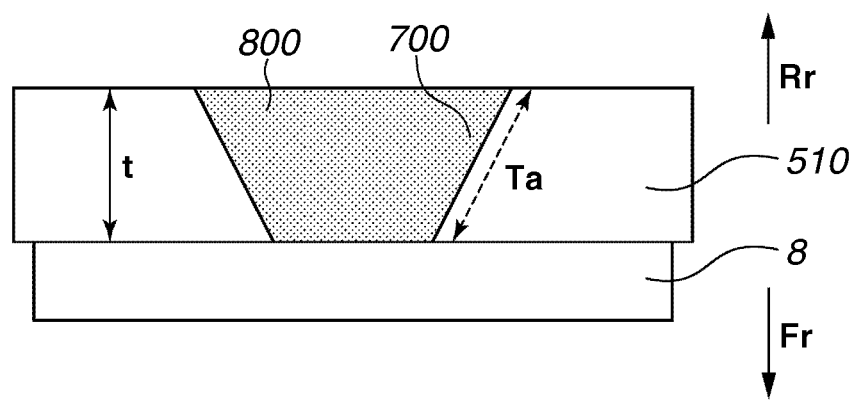
Figure 7C:
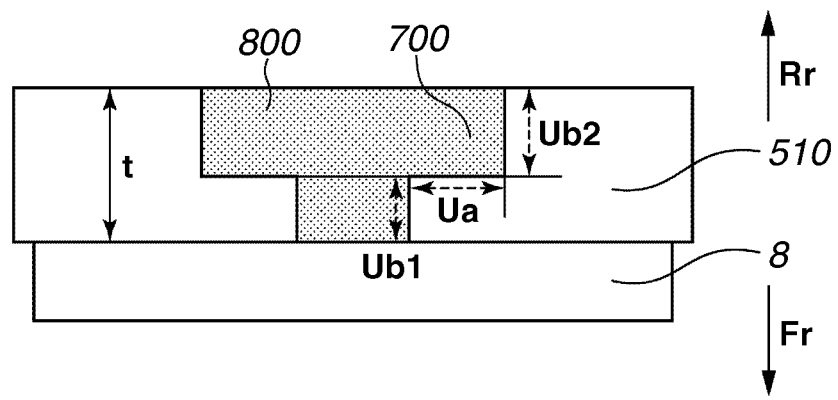

Herein, the cross section of the opening 700 will be described in detail with reference to the schematic diagrams of FIGS. 7A, 7B and 7C. FIG. 7A is a cross-sectional view of the opening 700 according to an exemplary embodiment, FIG. 7B is a first modification of the opening 700, and FIG. 7C is a second modification of the opening 700. FIGS. 7A, 7B and 7C illustrate a state where the adhesive 800 is poured or the adhesive 800 is cured. As illustrated in FIG. 7A, the thickness of the image sensor fixing member 510 is denoted by t, the chamfered portion of the opening 700 on the Rr direction side is denoted by Sa, and the surface of the opening 700 parallel to the optical axis is denoted by Sb. The adhesive 800 is poured from the Rr side to fit within the thickness t of the image sensor fixing member 510. When the adhesive is cured, the range of an adhesive interface becomes Sa+Sb>t and thus the adhesion interface becomes long. Therefore, the adhesion strength increases as compared to the opening of the surface only perpendicular to the thickness direction. Also, since the image sensor fixing member 510 and the image sensor 8 are disposed subsequently in the Fr direction and the adhesive 800 has an anchor structure, the adhesion strength in the Sa surface increases in a peeling force in the Rr direction.

FIG. 7B is a cross-sectional view of the opening 700, describing a first modification of the exemplary embodiment. An opening surface denoted by Ta is entirely inclined to the optical axis. As compared to the case of FIG. 7A, the anchor effect is strong and the adhesion strength is high. Moreover, the range of the adhesion interface becomes Ta>t.

FIG. 7C is a cross-sectional view of the opening 700, describing a second modification of the exemplary embodiment. The opening 700 is counter-bored on a side that does not face the image sensor, such that an opening width on the side not facing the image sensor 8 is formed to be larger than an opening width on the side facing the image sensor 8.

As illustrated in FIG. 7C, since the Ua surface of the opening 700 is substantially parallel to the surface of the image sensor fixing member 510, the anchor effect is highest. Moreover, since the range of the adhesion interface becomes Ua+Ub1+Ub2>t, the adhesion strength becomes very high.

However, if the image sensor fixing member 510 is made of a metallic material, since many portions are crushed during a press work, it is difficult to make the openings illustrated in FIGS. 7B and 7C. If a cutting work is performed, a shape creation is possible, but a component cost increases. Therefore, the shape, as illustrated in FIG. 7A, which can be created by a press work alone, can be realized in a mass production line.

Next, the projection arrangement of the openings 700 with respect to the image sensor 8 will be described in detail with reference to FIG. 5. The position of the openings 700 may be located at the substantially central portion with respect to the rear surface of the image sensor 8. In the exemplary embodiment, the arrangement of the openings 700 is limited to only the central portion of the regions equally divided by about three in the long-side direction (RL direction) of the rear surface of the image sensor 8. Generally, the image sensor fixing member 510 is made of a metallic member, such as aluminum, stainless steel, or iron, or is made of a mold part. On the other hand, the image sensor 8 is configured that a chip that is formed from a silicon wafer is packaged by ceramic or the like. For this reason, if a material of the image sensor fixing member 510 is different from a package material of the image sensor 8, a thermal strain is also different under temperature environment caused by a difference in linear expansion coefficient. As described above, in the digital single-lens reflex camera, the positional accuracy in the focus direction of the image sensor 8 is very important. Therefore, it is necessary to reduce the deformation of the image sensor 8 caused by the thermal strain, as much as possible, under temperature environment in which operations are guaranteed.

Figure 8A:
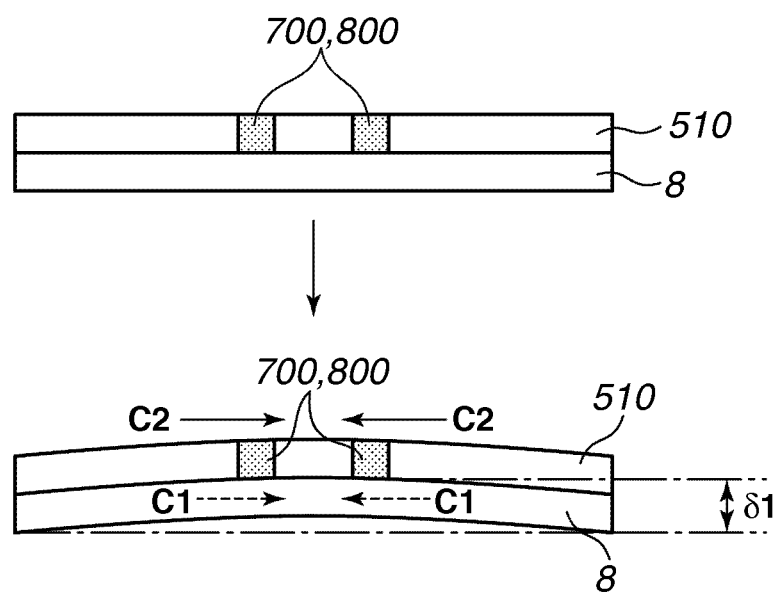
FIGS. 8A and 8B are schematic diagrams illustrating the influence of a thermal strain caused by a difference in linear expansion coefficient between an image sensor and an image sensor fixing member.
Figure 8B:
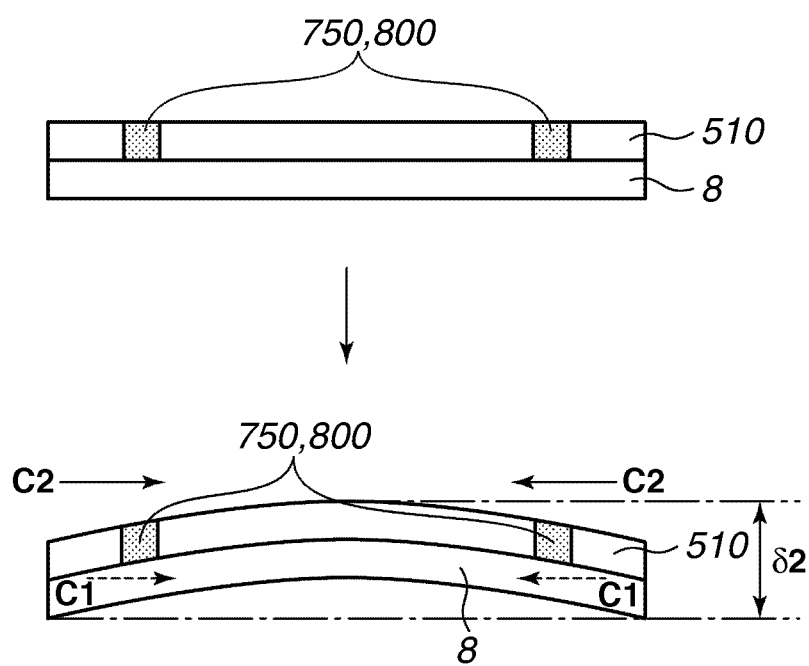

FIGS. 8A and 8B are schematic diagrams illustrating the effect of a thermal strain caused by a difference in linear expansion coefficient between the image sensor 8 and the image sensor fixing member 510. FIGS. 8A and 8B are schematic diagrams specialized to the image sensor 8, the image sensor fixing member 510, and the opening 700 of the cross-sectional view of FIG. 6. FIG. 8A illustrates an example in which the openings 700 are arranged at the substantially central portion of the rear surface of the image sensor 8, as in the exemplary embodiment. FIG. 8B is a comparative example in which the adhesion-purpose openings 750 are arranged substantially uniformly and widely on the rear surface of the image sensor 8.

The comparative example illustrates a state where the image sensor fixing member 510 is made of a material having a larger linear expansion coefficient than the image sensor 8, and an ambient temperature changes from a room temperature (about 23°) to a low temperature (about −20 to −30°). For example, under the low temperature, the image sensor 8 and the image sensor fixing member 510 shrink in a C1 direction (dotted arrow) and a C2 direction (solid arrow), respectively. In this case, as the openings 700, that is, the connection portion by adhesion, is closer to the central portion of the image sensor 8, the influence of the deformation becomes smaller (δ1<δ2).

Therefore, by arranging the openings 700 of the image sensor 8 at the substantially central portion of the image sensor 8, the deformation of the image sensor 8 caused by the thermal strain under low temperature or high temperature can be reduced.

Moreover, the openings 700 of the exemplary embodiment have a shape suitable for the pouring work of the adhesive 800. For example, the adhesive 800 used herein may be a photo-curable acrylic or epoxy ultraviolet curable resin. The ultraviolet curable resin can be rapidly cured and can reduce working hours.

Figure 9:
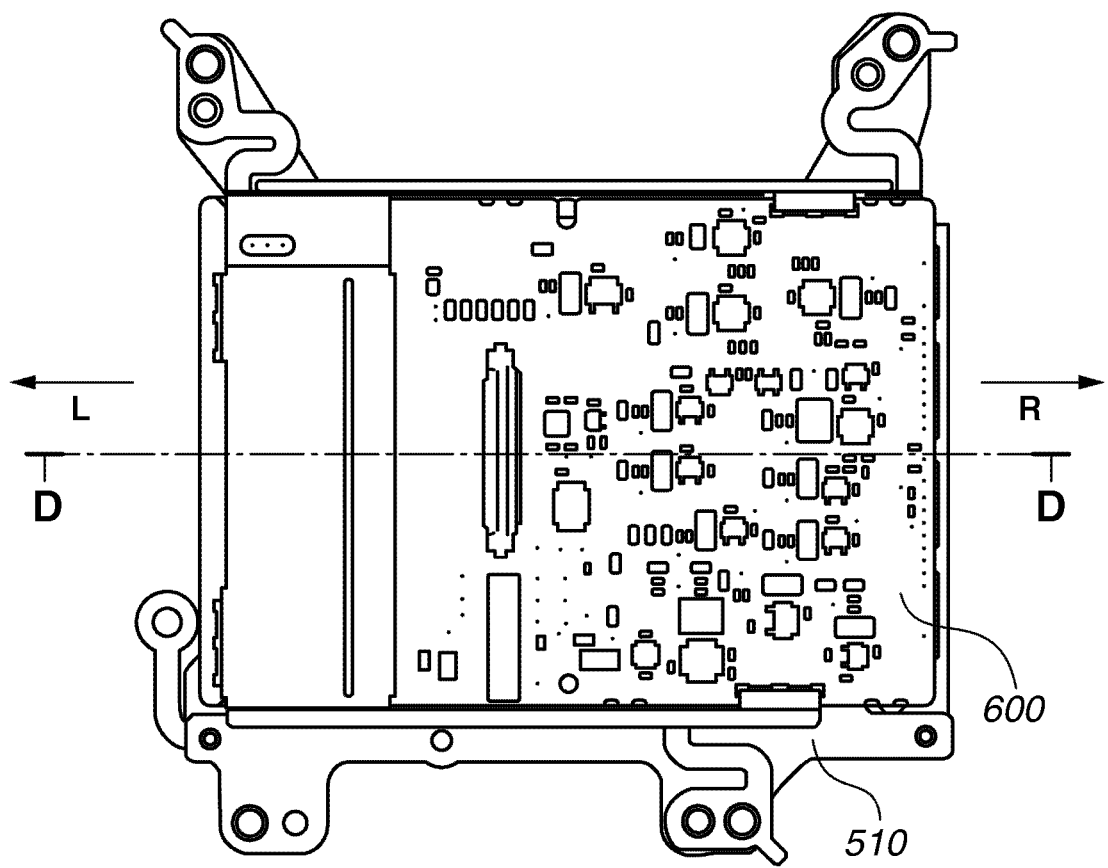
FIG. 9 is a rear view of an imaging unit according to an exemplary embodiment of the present invention.

FIG. 9 illustrates the rear view of the imaging unit 40. FIG. 10 is a cross-sectional view taken along the line D-D of FIG. 9 and a detailed view thereof. After positioning the image sensor 8 to the image sensor fixing member 510, the image sensor 8 adheres and is fixed to the image sensor fixing member 510 by pouring the adhesive 800 into the openings 700. Then, the signal processing board 600 is electrically connected to the image sensor 8 by a solder.

As illustrated in FIG. 10, for making the imaging unit 40 thinner, a gap between the image sensor fixing member 510 and the signal processing board 600 is made very narrow (d in FIG. 10). For this reason, in the adhesive pouring work, the overflow of the adhesive 800 from the openings 700 are not allowed. In the exemplary embodiment, since the chamfered portions Sa are formed in the openings 700, the width on the side, into which the adhesive 800 is poured, is wide. Therefore, the adhesive 800 is easily poured, and the overflow of the adhesive 800 from the openings 700 can be prevented. In addition, since the openings 700 is formed extending in the short side direction of the image sensor 8, a discharge work by a dispenser or the like becomes a linear operation, so that the work efficiency is excellent. Moreover, when using the photo-curable adhesive, light irradiation to the adhesive is important. Since the chamfered portions Sa are formed at the ends of the irradiation sides of the openings 700, the opening width on the light irradiation side is large, and the irradiation dose in the thickness direction of the adhesive 800 can be efficiently obtained.

The adhering and the fixing using the opening shape according to the exemplary embodiment, the adhesion force of about 100 times the weight of the imaging unit can be obtained, and a sufficient accuracy can also be ensured for the above-described drop impact of the camera.

Although exemplary embodiments of the present invention have been described above, the invention is not limited to these exemplary embodiments and various variations and modifications can be made within the scope of the invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-098587 filed Apr. 26, 2011, which is hereby incorporated by reference herein in its entirety.

What is claimed is:

1. An imaging apparatus comprising:
   an image sensor; and
   a fixing member in which an opening is formed,
   wherein the image sensor is positioned at the fixing member and adheres to and is fixed to the fixing member by pouring an adhesive into the opening,
   wherein the opening has a first opening part formed on a side not facing the image sensor and a second opening part formed on a side facing the image sensor,
   wherein the first opening part and the second opening part are arranged in a thickness direction of the fixing member,
   wherein the first opening part has a first opening width on the side not facing the image sensor,
   wherein the second opening part has a second opening width on the side facing the image sensor,
   wherein the second opening part is formed such that the second opening width is uniform,
   wherein the first opening part is formed such that the first opening width becomes gradually larger from the second opening width toward the side not facing the image sensor, and
   wherein in a case where the adhesive poured into the opening is cured, the cured adhesive reaches at least a part of the first opening part.

2. The imaging apparatus according to claim 1, wherein, the first opening part is formed by chamfering on the side not facing the image sensor, such that the first opening width becomes gradually larger from the second opening width toward the side not facing the image sensor.

3. The imaging apparatus according to claim 1, wherein a plurality of the openings are formed at a position corresponding to a substantially central portion of the image sensor in the long-side direction.

4. The imaging apparatus according to claim 1, wherein the adhesive is a photo-curable adhesive.

5. The imaging apparatus according to claim 1,
   wherein the opening is formed in a shape that extends in a short-side direction of the image sensor at a position corresponding to a substantially central portion of the image sensor in a long-side direction.

6. An imaging apparatus comprising:
   an image sensor; and
   a fixing member in which an opening is formed,
   wherein the image sensor is positioned at the fixing member and adheres to and is fixed to the fixing member by pouring an adhesive into the opening,
   wherein the opening has a first opening part formed on a side not facing the image sensor and a second opening part formed on a side facing the image sensor,
   wherein the first opening part and the second opening part are arranged in a thickness direction of the fixing member,
   wherein the first opening part has a first opening width on the side not facing the image sensor,
   wherein the second opening part has a second opening width on the side facing the image sensor,
   wherein the second opening part is formed such that the second opening width is uniform,
   wherein the first opening part is formed such that the first opening width becomes gradually larger from the second opening width toward the side not facing the image sensor, and
   wherein in a case where the adhesive poured into the opening is cured, at least a part of and outline of the first opening part becomes an adhesive interface between the image sensor and the fixing member.

7. The imaging apparatus according to claim 6, wherein, the outline of the first opening part is formed by chamfering on the side not facing the image sensor, such that the first opening width becomes gradually larger from the second opening width toward the side not facing the image sensor.

8. The imaging apparatus according to claim 6, wherein the opening is formed in a shape that extends in a short-side direction of the image sensor at a position corresponding to a substantially central portion of the image sensor in a long-side direction.

* * * * *